(12) United States Patent
Homyonfer et al.

(10) Patent No.: US 6,217,843 B1
(45) Date of Patent: Apr. 17, 2001

(54) METHOD FOR PREPARATION OF METAL INTERCALATED FULLERENE-LIKE METAL CHALCOGENIDES

(75) Inventors: Moshe Homyonfer, Holon; Reshef Tenne, Rehovot; Yishay Feldman, Ashdod, all of (IL)

(73) Assignee: Yeda Research and Development Co., Ltd., Rehovot (IL)

( * ) Notice: Subject to any disclaimer, the term of this patent is extended or adjusted under 35 U.S.C. 154(b) by 0 days.

(21) Appl. No.: 09/308,663

(22) PCT Filed: Nov. 27, 1997

(86) PCT No.: PCT/IL97/00390

§ 371 Date: Apr. 3, 2000

§ 102(e) Date: Apr. 3, 2000

(87) PCT Pub. No.: WO98/23796

PCT Pub. Date: Jun. 4, 1998

(30) Foreign Application Priority Data

Nov. 29, 1996 (IL) ............................................ 119719

(51) Int. Cl.[7] ............................. H01M 4/58; C01G 1/12; C30B 29/16; C30B 29/46; C30B 29/60

(52) U.S. Cl. ................... 423/593; 252/501.1; 252/518.1; 252/519.1; 252/519.14; 252/519.4; 423/592; 423/618; 423/624; 423/596; 423/598; 423/606; 423/608; 423/610; 423/635; 423/641; 423/566.2; 423/566.3; 427/331; 427/335; 427/372.2; 508/108

(58) Field of Search ..................................... 423/592, 618, 423/624, 596, 598, 606, 608, 610, 635, 641, 566.2, 566.3; 427/372.2, 331, 335; 252/501.1, 518.1, 519.1, 519.14, 519.4; 508/108

(56) References Cited

FOREIGN PATENT DOCUMENTS 0580019    1/1994   (EP).
0736487   10/1996   (EP).

OTHER PUBLICATIONS

Frey et al., "Inorganic Fullerene–Like MS (M–Mo,W) Structures: Synthesis Reaction Mechanism and Characterization", *Int'l. Winterschool on Electronic Properties of Novel Materials*, pp. 445–453, (1996).

Feldman et al., "Bulk Synthesis of Inorganic Fullerne–Like MS (M=Mo, W) from the Respective Trioxides and the Reaction Mechanism", *J. Am. Chem. Soc.*, vol.118, pp. 5362–5367, (1996).

Alperson et al., "Room–temperture conductance spectroscopy of CdSe quantum dots using a modified scanning force microscope", *Physical Review B*, vol.52, No.24, pp. R17017–17020, (1995).

(List continued on next page.)

*Primary Examiner*—Archene Turner
(74) *Attorney, Agent, or Firm*—Browdy and Neimark

(57) ABSTRACT

A method for the preparation of nanoparticles of metal oxides containing inserted metal particles and to metal-intercalated and/or metal-encaged "inorganic fullerene-like" (hereinafter IF) structures of metal chalcogenides obtained therefrom is provided, which comprises heating a metal I material with water vapor or electron beam evaporation of said metal I material with water or another suitable solvent, in the presence of a metal II salt, and recovering the metal II-doped metal I oxide, or proceeding to subsequent sulfidization, yielding bulk quantities of metal II-intercalated or metal II-encaged IF structures of the metal I chalcogenide. The metal II salt is preferably an alkaline, alkaline earth or transition metal salt, most preferably an alkali chloride. The intercalated and/or encaged IF structures are usable as lubricants. They also form stable suspensions, e.g. in alcohol, and electrophoretic deposition from said suspensions yields thin films of the intercalated IF materials, which have a range of potential applications.

21 Claims, 9 Drawing Sheets

OTHER PUBLICATIONS

Ajayan et al., "Capillarity–induced filling of carbon nanotubes", S. *Nature*, vol.361, pp. 333, (1993).

Bethune et al., "Cobalt–catalysed growth of carbonnanotubes with single–atomic–Layerwalls", *Letters To Nature* vol. 363, pp. 605, (1993).

Chopra et al., "Boron Nitride Nanotubes", *Science*, vol. 269, pp. 966–967, (1995).

Zhou et al., "Defects in Carbon Nanostructures", *Science*, vol. 263, pp.1744–1747, (1994).

Yacaman et al., "Studies of MoS2 structures produced by electron irradiation", Appl. Phys. Lett. vol. 69, No.8 pp.1065–1066, (1996).

Feldman et al., "High–Rate, Gas–Phase Growth of Mos2 Nested Inorganic Fullerenes anf Nanotubes", *Science* vol. 267, pp. 222–225, (1995).

Feldman et al., "Bulk Synthesis of Inorganic Fullerene–Like MS2 (M=Mo,W) from the respective Trioxides and the Reactions Mechanism", *Journal of the American Chemical Society*, vol. 118, No. 23, pp. 5362–5367 (no/date/month).

Golan et al., "Vacuum–deposited gold films", *Surface Science*, vol. 264, pp. 312–326, (1992).

Homyonfer et al., "Scanning Tunneling Microscope Induced Crystallization of Fullerene–Like MoS2", *Journal of the American Chemical Society*, vol. 118, No. 33, pp. 7804–7808, (1996).

Lijima, "Helical microtubules of graphitic carbon", *Letters to Nature*, vol. 354, pp. 56–58, (1991).

Iijima et al., "Pentagons Heptagons and negative curvature in graphite microtubule growth", *Nature*, vol. 356 pp. 776–778, (1992).

Iijima et al., "Single–shell carbon nantubes of 1–nm diameter", *Nature*, vol. 363, pp. 603–605 (no date/month).

Joensen et al., "Single–Layer MoS2", *Mater. Res Bull.*, vol. 21, pp. 457–461, (1986) (no month).

Margulis et al., "Nested Fullerene–like structures", *Nature*, vol. 365, pp. 113–114, (1993).

Saroano et al., "Alkali metal imtercalates of molybdenum disulfide", *The Journal of Chemical Physics*, vol. 58 No. 2, (1973).

Srolovitz et al., "Morphology of Nested Fullerenes", *The American Physical Society*, vol. 74, No. 10, pp. 1779–1782, (1995).

Stephan et al., "Doping Graphitic and Carbon Nantubes Structures with Baron and Nitrogen", *Science*, vol. 266 pp. 1683–1685, (1994).

Tenne et al., "Polyhedral and cylindrical structures of tungsten disulphide", *Nature*, vol. 360, pp. 444–446 (1992).

Terrones et al., "Beyond C60: Graphite Structures for the Future", *Chem. Soc. Rev.*, pp. 341–350, (1995).

Ugarte, "Curling and closure of graphitic networks under electron–beam irradiation", *Letters to Nature* vol.359, pp. 707–709, (1992).

Dimigen et al., "Lubrication Properties of R.F. Sputtered MoS2 Layers with Variable Staichiametry" *Thin Solids Films*, vol. 64, pp. 221, (1979).

Dunlap et al., "Connecting carbon tubules", *Phys. Rev. B.*, vol. 46, pp. 1933–1936, (1992).

METHOD FOR PREPARATION OF METAL INTERCALATED FULLERENE-LIKE METAL CHALCOGENIDES

CROSS REFERENCE TO RELATED APPLICATION

The present application is the national stage under 35 U.S.C. 371 of PCT/IL97/00390, filed Nov. 27, 1997.

FIELD OF THE INVENTION

The present invention relates to a method for the preparation of nanoparticles of metal oxides containing inserted metal particles and to metal-intercalated and/or metal-encaged "inorganic fullerene-like" (hereinafter IF) structures of metal chalcogenides obtained therefrom. According to the invention, either heating a metal I material with water vapor or electron beam evaporation of said metal I material with water or another suitable solvent, in the presence of a metal II salt, produces metal II-doped metal I oxides, and subsequent sulfidization, yields bulk quantities of metal II-intercalated or metal II-encaged IF structures (nested fullerenes, nanotubes, and structures with negative curvature) of metal I chalcogenides. The intercalated and/or encaged IF structures form stable suspensions, e.g. in alcohol, and electrophoretic deposition from said suspensions yields thin films of the intercalated IF materials, with a range of potential applications such as the photosensitive element in solar cells, for the fabrication of inert scanning probe microscope (SPM, that includes both STM=scanning tunneling microscope and SFM=scanning force microscope) tips, secondary batteries and electrochromic devices. The metal-intercalated or metal-encaged IF structures can further be used as solid lubricants.

BACKGROUND OF THE INVENTION

Nanoclusters of various inorganic layered compounds, like metal dichalcogenides—$MX_2$ (M=Mo,W;X=S,Se), are known to be unstable in the planar form and to form a hollow cage—inorganic fullerene-like (IF—$MX_2$) structures such as nested fillerenes and nanotubes (Tenne et al., 1992; Feldman et al., 1995 and 1996; published European Patent application No. EP 0580019) and structures with negative curvature (Schwartzites). Not surprisingly, nanoparticles of hexagonal boronitrides with graphite-like structure behaved similarly (Stephan et al., 1994; Chopra et al., 1995). Furthermore, nested fullerene-like polyhedra of $MoS_2$ were synthesized at room temperature by a stimulus from an electron beam (José-Yacamán et al., 1996) in analogy to carbon-nested fullerenes (Ugarte, 1992), and also by application of an electric pulse from the tip of a scanning tunneling microscope (STM) (Homyonfer et al., 1996).

Intercalation of carbon nanotubes with alkali metal atoms from the vapor phase was recently described (Zhou et al., 1994). The intercalated films were found to arrange in stage-1 (n=1) superlattice, i.e. alkali-metal layers were stacked between each two carbon layers. The composite nanostructures were found to disintegrate when exposed to air, and complete shattering of the nanotubes (exfoliation) was obtained upon immersion in water. The intercalation of 2 H—$MoS_2$ and 2 H—$WS_2$ compounds was discussed in detail (Brec and Rouxel, 1986; Friend and Yoffe, 1987; Somoano et al., 1973), but staging was not observed in either of the former compounds, i.e. the alkali atoms were found to have a random distribution. Here too, deintercalation occurs upon exposure to air and exfoliation upon immersion in water.

SUMMARY OF THE INVENTION

It is an object of the present invention to provide a new method for the synthesis of large quantities of IF structures of metal chalcogenides that affords intercalation of the IF structures with various metal atoms. Metal intercalation has a remarkable influence on the solubility of these IF structures in aprotic solvents. The formations of stable suspensions from the metal-intercalated or metal-encaged IF structures permits deposition of thin films, with a range of potential applications such as the use of such films as the photosensitive element in solar cells, for the fabrication of inert SPM tips, secondary batteries and electrochromic devices.

The present invention thus relates, in one aspect, to a method for the preparation of nanoparticles or nanowhiskers of a metal II-doped metal I oxide, wherein said metal I is selected from In, Ga, Sn and a transition metal and said metal II is any metal, preferably a metal selected from an alkali, alkaline earth or a transition metal, which method comprises:

(i) heating a metal I material with water in a vacuum apparatus at a base pressure of $10^{-3}$ to $10^{-5}$ Torr or electron beam evaporating a metal I material with water or with an oxygen-containing volatile solvent in a vacuum apparatus at a base pressure of $10^{-5}$ to $10^{-6}$ Torr, in the presence of a metal II salt, and (ii) recovering the metal II-doped metal I oxide from the walls of the vacuum apparatus.

The metal I material may be the metal I itself or a mixture of 2 or more different metals I, or a substance comprising a metal I or a mixture of substances comprising 2 or more different metals I. Examples of transition metals include, but are not limited to, Mo, W, V, Zr, Hf, Pt, Re, Nb, Ta Ti, and Ru. The elctron beam evaporation embodiment is more suitable for refractory transition metals, e.g. Nb, V, Ta, Ti.

Examples of metal II salts include, but are not limited to, alkali metal chlorides such as NaCl, KCl, LiCl and CsCl. Examples of doped oxides thus prepared include, but are not limited to, Na, K, Li or Cs-doped $MoO_{3-x}$, preferably $MoO_2$ and $MoO_3$, or Na, K, Li or Cs-doped $WO_{3-x}$, preferably $WO_3$ and $W_{18}O_{49}$, or Na, K, Li or Cs-doped mixed oxide such as $Mo_xW_{1-x}O_3$, wherein x is from 0 to 1, and Na, K, Li or Cs-doped $V_2O_5$, preferably Li-doped $V_2O_5$.

According to the invention, the metal II salt may be added to the water or to the oxygen-containing volatile solvent, or when it is NaCl or KCl, it is already present in the water.

Examples of suitable oxygen-containing volatile solvents are, without being limited to, acetone, ethanol, methanol.

The metal II-doped metal I oxides thus prepared are useful as starting products for the preparation of metal II-intercalated and/or metal II-encaged inorganic fuillerene-like (IF) structures of a metal I chalcogenide, wherein metal I and metal II are as defined above, which method comprises:

(i) heating a metal I material with water in a vacuum apparatus at a base pressure of $10^{-3}$ to $10^{-5}$ Torr or electron beam evaporating a metal I material with water or with an oxygen-containing volatile solvent in a vacuum apparatus at a base pressure of $10^{-5}$ to $10^{-6}$ Torr, in the presence of a metal II salt;

(ii) arnealing the metal II-doped metal I oxide obtained in step (i) in a reducing atmosphere with a $H_2X$ gas, wherein X is S, Se, or Te; and (iii) recovering the metal II-intercalated and/or metal II-encaged inorganic fullerene-like (IF) structures of the metal I chalcogenide.

The expression "inorganic fullerene-like" ("IF") as used herein refers to inorganic metal chalcogenide structures having one layer or nested layers which form what is known in the art as a closed cage (Tenne et al., 1992; Margulis et al., 1993) which may encage a core or may form a stuffed nested layer structure. In particular, the term refers to structures such as what is known in the art as single and double layer inorganic fullerenes (Srolovitz et al., 1995), nested layer inorganic fullerene (Tenne et al., 1992), stuffed inorganic fullerenes (Margulis et al., 1993), structures with negative curvature (Schwartzites), single layer nanotubes (Bethune et al., 1993; Iijima and Ichiashi, 1993), nested nanotubes (Iijima, 1991) and stuffed nanotubes (Ajayan and Iijima, 1993).

Thus, IF structures of metal I chalcogenides intercalated with metal II particles, said IF structures including one or more metal I chalcogenide layers of desired size and shape (e.g. spheres, nanotubes, structures with negative curvature (Schwartzites), and polyhedral shapes), being hollowed or having a metal II-doped metal I oxide core, may be produced using the method of the present invention.

As used herein, "metal II-encaged IF structures of metal I chalcogenide" refers to IF structures including 1–2 layers of the metal I chalcogenide, e.g. sulfide, encaging a metal II-doped metal I oxide core, and "metal II-intercalated IF structures of metal I chalcogenide" refers to IF structures including more than 2 layers of the metal I chalcogenide, e.g. sulfide, either intercalated with metal II and being devoid of a metal oxide core (after full conversion of the oxide to sulfide) or being metal II-intercalated and encaging a metal II-doped metal I oxide core (partial conversion of the oxide).

The metal II-doped metal I oxide can be obtained in the form of nanoparticles or nanowhiskers according to controllable change of parameters of the reaction. Thus, for example, for the preparation of Na doped-$WO_{3-x}$, W is heated in the presence of water vapor by transferring a current of about 100 Amp and about 10 volt during which a plume of metal oxide is formed within the vacuum system, and coloration of the bell-jar due to deposition of a fine powder of the metal oxide on the walls is obtained. For the obtention of nanoparticles of Na doped-$WO_{3-x}$, the amount of water used is about 2–3 cc and the evaporation should not take more than 5 min, i.e. the current is stopped at most 5 minutes counted from the moment that the deep blue plume is observed, while for the obtention of nanowhiskers, the amount of water should be 3–5 cc and the duration of the evaporation should be of 5–10 min.

The shape of the metal II-intercalated and/or metal II-encaged IF structures of metal I chalcogenide obtained from the metal II-doped metal I oxide will depend on the shape of the latter. Thus, nanoparticles of the metal oxide will produce single layer IF and nested layer IF, while nanowhiskers of the metal oxide will produce single layer and nested layer nanotubes. Thus according to the invention it was for the first time possible to produce metal-intercalated IF structures of a metal chalcogenide encaging metal particles in its core, with a predetermined shape.

Thus, in another aspect, the present invention provides novel metal II-intercalated and/or metal II-encaged inorganic fullerene-like (IF) structures of a metal I chalcogenide, wherein metal I and metal II are as hereinabove defined and said structures include one or more layers of desired size and shape e.g. spheres, whiskers and polyhedral shapes, such as nested fillerenes and nanotubes with single, double or multiple layers, which may encage a metal oxide core or a void (i.e. be hollowed, after full conversion of the metal oxide) and structures with negative curvature (Schwartzites).

The new metal II-intercalated and/or metal II-encaged IF structures of metal I chalcogenides of the invention give stable suspensions in polar solvents, e.g. water, alcohols, etc., i.e. they do not decompose nor precipitate as the non-metal intercalated IF structures of the prior art.

Thus, in still another aspect, the invention provides a method for the production of thin films of metal II-intercalated and/or metal II-encaged IF of metal I chalcogenides, which method comprises suspension of said metal II-intercalated and/or metal II-encaged IF in a polar solvent and either evaporation of the solvent or electrophoretic deposition onto a conductive, e.g. gold, substrate. These thin films, most preferably films obtained from metal II-encaged IF structures of metal I chalcogenide as defined herein, can be used as the photosensitive element in solar cells, in electrochromic devices, in batteries such as Li rechargeable, hydride and rechargeable batteries, and for coating SPM tips.

Thus, in a further aspect, the invention relates to tips for scanning probe microscopy (both STM and SFM) such as Si or $Si_3N_4$ tips, which are coated with a single layer of a metal II-encaged or metal II-intercalated IF of a metal I chalcogenide. These IF-coated tips are robust and show low adhesion, and are prepared by depositing films of the IF structures on the tips.

In still another aspect, the present invention relates to the use of the metal II-intercalated and/or metal II-encaged inorganic IF structures of a metal I chalcogenide of the invention as lubricants, particularly in solid lubrication, such as in high or low temperature environments or under ultra high vacuum where liquid lubricants are not suitable (see Dimigen et al., 1979) and in ferrofluid lubrication, sealing and levitation applications. Since the outer surface of the IF material exposes only the basal plane of the compound, this material lends itself to solid lubrication applications. Indeed, IF nanoparticles do not stick to each other or the substrate and exhibit poor surface adhesion. Their approximate spherosymetric shapes imply easy sliding and rolling of the nanoparticles and consequently very small shear forces are required to move them on the substrate surface.

DESCRIPTION OF THE DRAWINGS

2: 3(a) oblate and quasi-spherical IF particles; 3(b) nanotubes; 3(c) torus exhibiting negative curvature (Schwartzite). FIG. 3d shows a full-fledged IF-WS$_2$ film on a Au substrate. The IF film was deposited by first evaporating a gold film (35 nm) on mica and annealing it to 250° C. for 12 hr, which resulted in {111} textured Au crystallites with a typical size of 1 mm. The IF films were obtained by applying a bias of 20 V between the gold cathode and a Pt foil which were immersed in the intercalated IF suspension. IF films up to 500 nn in thickness were obtained by this procedure.

DETAILED DESCRIPTION OF PREFERRED EMBODIMENTS

The invention will now be illustrated in a non-limiting way according to the following examples and the accompanying drawings.

EXAMPLE 1

General procedure for synthesizing alkali-metal intercalated IF structures and for fabricating the films: As illustrated in the flow chart of FIG. 1, the processes used for synthesizing alkali-metal intercalated IF structures and for fabricating the films. from, e.g. IF-WS$_2$, comprise the following steps.

Figure 2A:
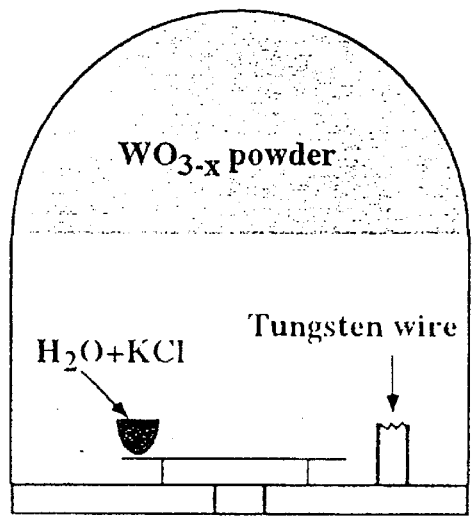
FIG. 2(a) is a schematic representation of the evaporation apparatus used for the synthesis of the oxide nanoparticles and whiskers. In the first stage, the belljar was evacuated to ca. $10^{-5}$ Torr. The tungsten (molybdenum) wire was cleaned by heating it close to its melting temperature for a few minutes, after which the system was allowed to cool to ambient temperatures. The bell-ar was opened for a short while and a beaker with about 3 ml of water was inserted. Upon evacuation to about $10^{-3}$ Torr, the water in the beaker froze. At this point the gate valve was closed and the W wire heated again. After a few minutes the wall of the belljar was covered with a blue oxide powder which was collected for characterization and further processing. The size of the oxide particles and their shape could be varied according to the process parameters, like pumping speed, vacuum, etc.

The first step in this hierarchy consists of synthesizing oxide powder in a modified vacuum deposition apparatus (see FIG. 2a). For that purpose, a W (or other metal) wire was heated and evaporated in the presence of water vapor. Metal or metal oxides could be evaporated from tungsten boats, but this would usually lead to mixed tungsten-metal oxide (and sulfide after sulfidization) nanoparticles. To intercalate the IF particles with metal atoms, metal-doped oxide nanoparticles were first prepared. This was done by dissolving $10^{-3}$–$10^{-2}$ M of alkali metal salts, like NaCl, KCl, and CsCl, in the water and coevaporating it together with the heated wire to form alkali-doped metal oxides. Further experimental details of the apparatus and the work protocol are described in the description of FIG. 2. As a result of this process, a blue metal oxide film accrued on the walls ofthe bell-jar.

Figure 1:
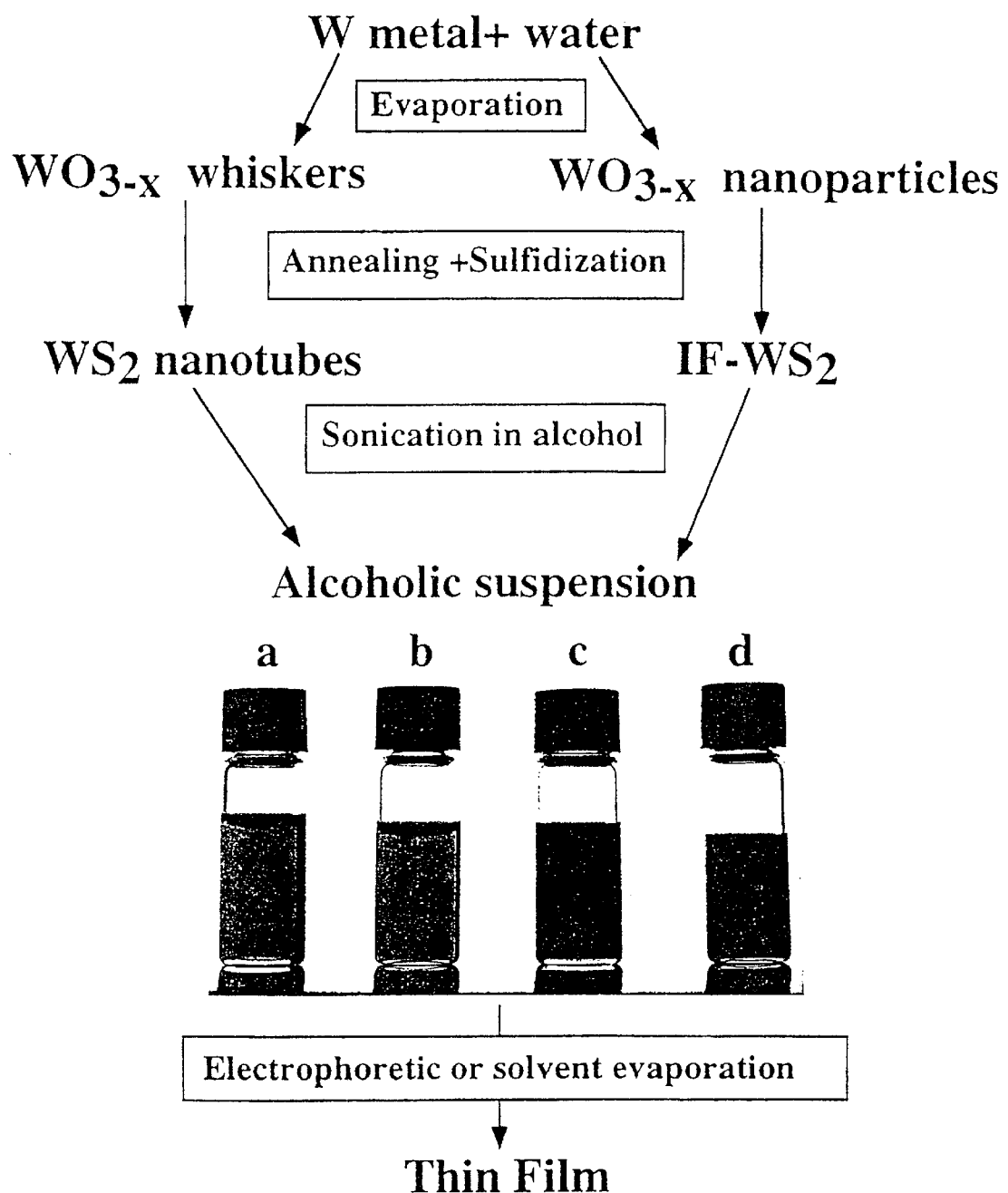
FIG. 1 illustrates a flow chart of the processes used for synthesizing alkali-metal intercalated IF structures and for fabricating the films, from, e.g. IF-$WS_2$ ($MoS_2$). To obtain the suspensions, a 50 mg portion of IF particles (nanotubes) was mixed with 50 ml ethanol, and the mixture was sonicated for 5 min.

In another embodiment of this first step, electron beam evaporation of a metal I material is carried out with water or with an oxygen-containing volatile solvent in a vacuum apparatus at a base pressure of $10^{-5}$ to $10^{-6}$ Torr, In the second step of the scheme of FIG. 1, the oxide powder was converted into a sulfide with nested fullerene or nanotubes structures (generically known as inorganic fullerene-like material-IF), by annealing the oxide in a reducing atmosphere with H$_2$S gas (Feldman et al., 1996).

Stable alcoholic suspensions of the IF particles synthesized in the second step were obtained by mixing a few milligrams of the intercalated IF powder in 3 ml of various alcohols, e.g. ethanol and sonication of the mixture (third step of scheme of FIG. 1). The solubility of the IF particles was found to be proportional to the amount of intercalant, whereas IF particles containing >8% of alkali-metal atoms were totally stable, and nonintercalated IF particles did not form stable suspensions at all.

Next, deposition of intercalated IF films from the suspensions was accomplished (fourth step in scheme of FIG. 1), using two alternative routes: solvent evaporation or electrophoretic deposition onto gold substrates, which were prepared as described (Golan et al., 1992; Alperson et al., 1995). In general, electrophoretic deposition resulted in more adhesive films and was therefore preferentially used according to the invention.

Transmission electron microscopy (TEM) was used for lattice imaging and electron diffraction of the nanoparticles. The composition of the oxide and sulfide nanoparticles was established using energy-dispersive X-ray analysis (EDS Link model ISIS) mounted on a high resolution TEM (200 kV, JEOL Model 2010) with probe size of 5 nm. The alkali metal concentration in the oxide precursor was determined by inductive coupled plasma (Spectro- Spectroflame ICP) analysis and by X-ray photoelectron spectroscopy (Kratos Axis-HS using monochromatized Al k$_\alpha$ radiation). X-ray powder diffraction (Scintag Theta-Theta XRD equipped with liquid nitrogen cooled Ge solid state detector, equipped with Cu k$_\alpha$ anode) was used to determine the crystallinity and phase of the oxide (sulfide).

Scanning force microscope (SFM) and scanning tunneling microscope (STM) were used to image the IF film surface both in noncontact and contact modes (SFM) and in photoassisted imaging mode (STM). All SFM and STM work was done on a Topometrix TMX 2010 Discoverer system. For contact mode force microscopy, the probes were either Si$_3$N$_4$ (Park Scientific) or single crystal Si (Nanoprobe) microfabricated tips. Fullerene tips were prepared by electrophoretic deposition on the latter, as described below. For intermittent contact mode, Si probes (Nanoprobe) with resonance frequency of 260–320 kHz were used. STM was performed using mechanically cut PtIr tips. For the photoassisted measurements, a 650 nrm laser diode (Toshiba) was focused to the junction so that the focused fluence was 30–50 mW/cm$^2$. The laser was operated either CW or modulated at 3–5 kHz. In the latter case, the modulated current signal was processed by a lock-in amplifier (SRS530).

Photocurrent measurements and electrolyte electrotransmission (EET) were carried out on a standard computerized photoresponse set-up, equipped with a light source, monochromator, potentiostat, lock-in amplifier, voltage modulator, and optics. For these measurements, a copper wire was attached to the gold substrate of the IF film, and the entire electrode, except for the front surface, was covered with an insulating resin. A standard photoelectrochemical cell with Pt mesh as counter electrode and Pt wire as a reference electrode was used.

EXAMPLE 2

Figure 2B:
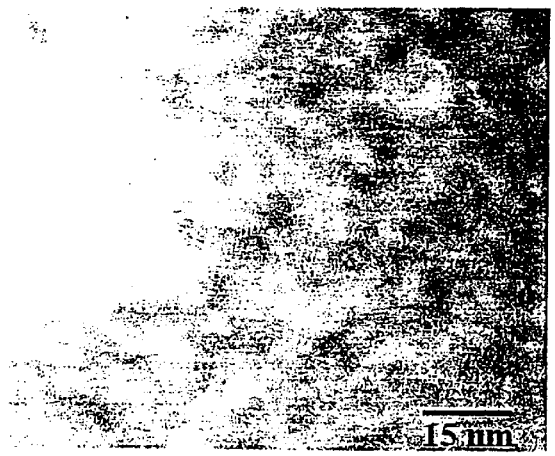
FIGS. 2b–2d are TEM images of the oxide precursors: 2(b) small (<10 nm) and 2(c) large (ca. 50 nm) spherical particles; 2(d) whiskers.
Figure 2D:
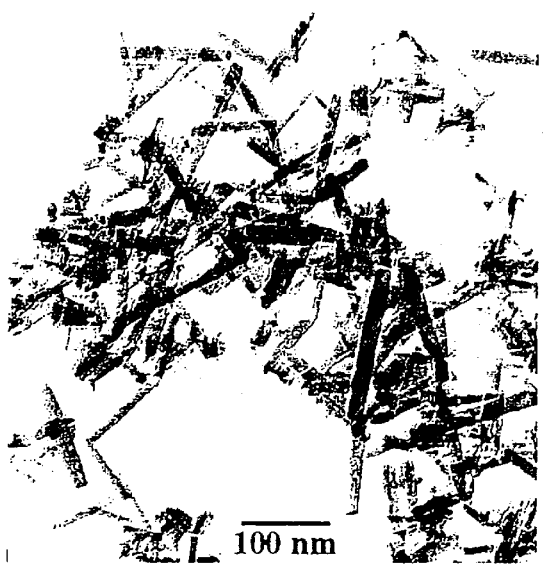
Figure 2C:
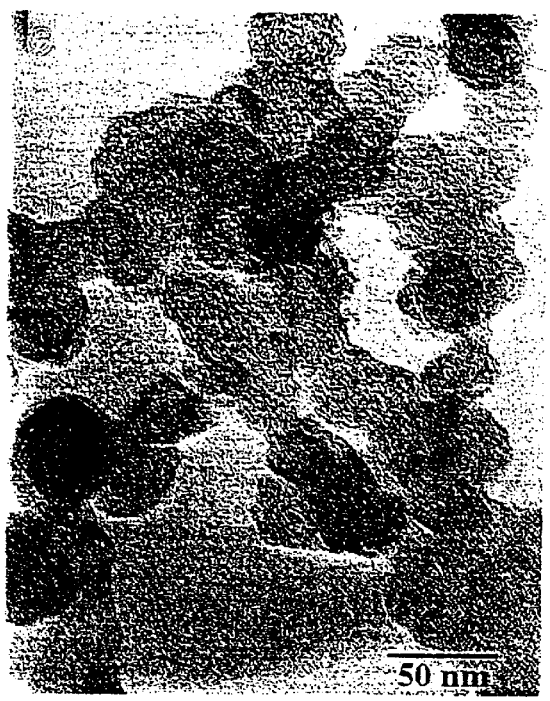

Using the evaporation method described in Example 1 above, the particle sizes (which vary between 7–50 nm) and shapes could be varied by varying the experimental conditions. This is illustrated by the TEM images of the oxide nanoparticles, as shown in FIGS. 2b and 2c. Their composition was established using energy-dispersive X-ray analysis (EDS) mounted on a high resolution TEM (200 kV) and was found to vary between WO$_{2.9}$ and WO$_{2.5}$. Tungsten oxide is known to have stable unstoichiometric phases with O/W ratio varying in this range (Wells, 1962). The alkali metal content in the oxide precursor was determined by inductive coupled plasma (ICP) analysis and by X-ray photoelectron spectroscopy (XPS) and was found to vary between 4 and 8 atomic %. X-ray powder diffraction (XRD) indicated that the oxide precursor was mainly amorphous. Using a lower vacuum (10$^{-3}$ Torr) and higher pumping speed, which produced more water vapor, a blue powder consisting mainly of oxide nanowhiskers with an average size of 300 nm was deposited on the bell-jar (FIG. 2d). Careful control of the evaporation conditions was imperative for maintaining a high yield of the oxide nanoparticles and nanowhiskers. In particular, the metal cleaning process prior to the evaporation was found to be very important for the success of the process.

EXAMPLE 3

The sulfidization process of oxide nanoparticles and the production of IF materials of various kinds have been developed by the present inventors (Feldman et al., 1995, 1996). The sulfidization starts at the outermost surface of the oxide, and the oxide core is progressively consumed and converted into sulfide. For the IF-WS$_2$ material, a solid-gas reaction between WO$_3$ and H$_2$S has been adopted, while gas phase reaction between MoO$_3$ and H$_2$S was undertaken for the synthesis of IF-MoS$_2$. Interestingly, the alkali-metal doped molybdenum-oxide powder obtained in the apparatus of the present invention (FIG. 2a) is much less volatile than the nonintercalated nanoparticles described before. Therefore, the simpler solid-gas reaction between MoO$_3$ powder and H$_2$S gas was adopted for the synthesis of IF-MoS$_2$.

Figure 3A:
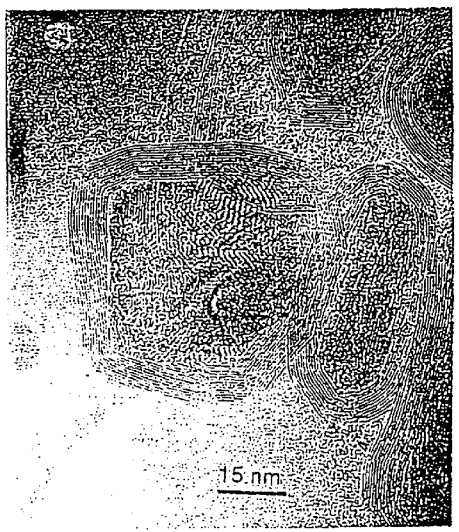
FIGS. 3a–3d are TEM images of tungsten-sulfide nanoparticles obtained from the oxide precursors shown in FIG.
Figure 3B:
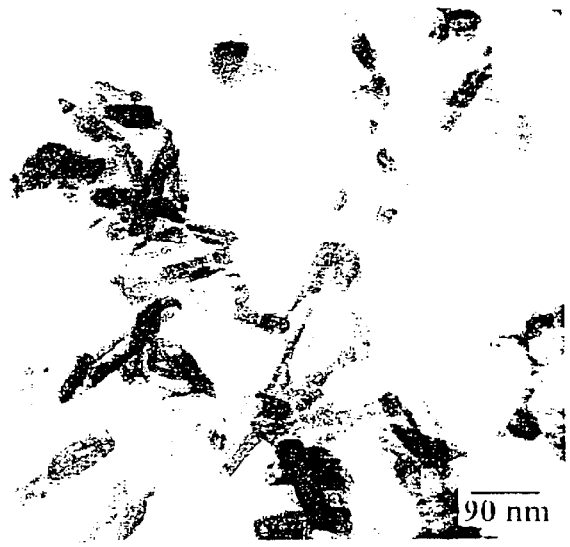
Figure 3C:
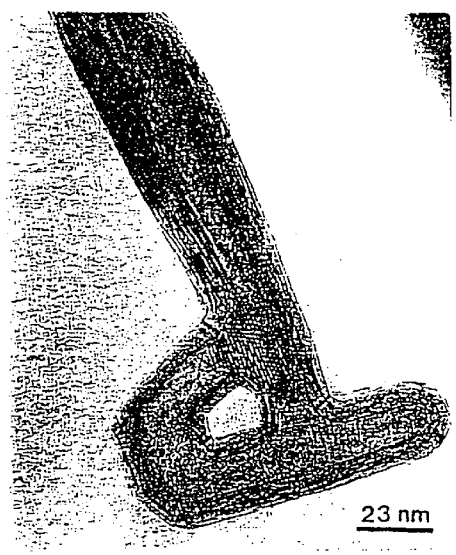

Following the sulfidization of the oxide nanoparticles, IF structures with a near to spherical shape or polyhedral topology were obtained from the quasi-spherical oxide particles (FIG. 3a), while nanotubes, which were closed at both ends, were obtained from oxide whiskers (FIG. 3b). The size of the IF particles retained the size of the oxide precursor particles. An abundance of T-bars, closed from three ends, and in one case even a torus (FIG. 3c) structure, all showing negative curvature (Ijima et al., 1992; Terrones et al., 1995; Dunlap, 1992), were obtained by a similar procedure. The number of closed sulfide layers in the IF structures could be controlled through the firing time. Because the reaction can be interrupted at any time, macroscopic amounts of fullerene-like structures and nanotubes with different numbers of sulfide layers and an oxide core including single, double, or multiple layers (with oxide core) or fully converted (hollow) IF, were obtained.

In general, the intercalation process is not limited to the metallic atoms and intercalation of solvent molecules from solutions cannot be avoided (Somoano et al.,1979). However, in the present process, water molecules, if at all incorporated into the oxide particles, would be outgassed during the sulfide synthesis. Indeed, no evidence for the intercalation of solvent molecules into the host lattice was found. Furthermore, since no prismatic edge planes (1120) exist in these closed structures, intercalation of solvent molecules, which makes the 2H platelets susceptible to solvent intercalation and exfoliation (Somoano et al., 1979; Jonson et al., 1986), was avoided.

EXAMPLE 4

Figure 4:
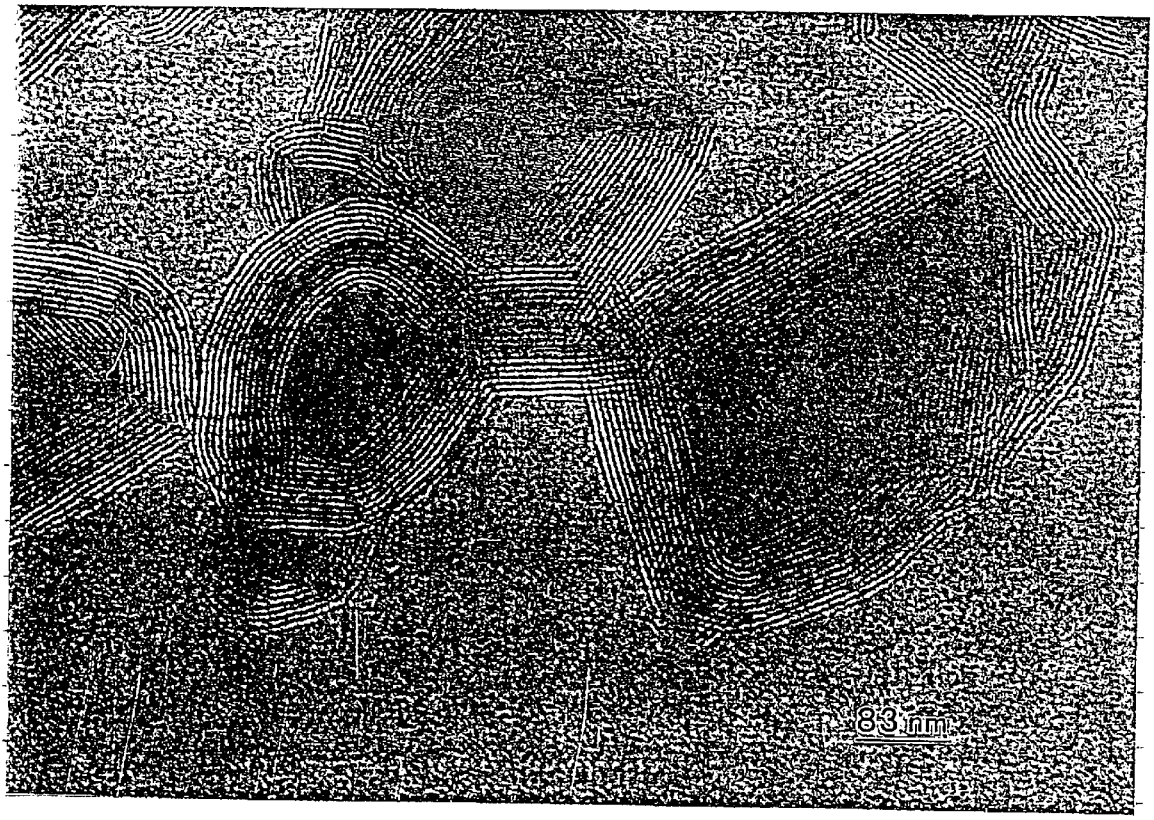
FIG. 4 is a TEM micrograph showing the lattice image of VS$_2$ nested fullerene-like particles obtained from the respective oxide nanoparticles which were produced by the apparatus of FIG. 2a. Lattice spacing (c) is 0.61 nm.

The above method is rather versatile and is not limited to IF of Mo or W chalcogenides. FIG. 4 presents the lattice-image of VS$_2$ fullerene-like particles which were obtained with the same apparatus. IF structures of $\gamma$-In$_2$S$_3$ were also obtained but are not shown. The starting material for IF-VS$_2$ was V$_2$O$_5$ which was heated in a molybdenum boat in the presence of water vapor. This explains the observation that some of the nanoparticles were mixed IF-V$_x$Mo$_{1-x}$S$_2$. The precursor for In$_2$O$_3$ was In shot heated in a Mo boat. This shows the versatility of the present procedure, which in fact can be used for the synthesis of IF structures from virtually any metal chalcogenide having a layered-type structure. Therefore, mixed IF of the formulas M$_{1x}$M$_{1'1-x}$S$_2$ and M$_1$S$_{2-x}$Se$_x$ can be obtained in the process.

EXAMPLE 5

The IF powder synthesized in the second step formed very stable suspensions in various alcohols upon sonication (third step of scheme of FIG. 1). A picture of several vials containing suspensions of oxide (translucent blue, vial a) and IF particles (green, brown to black-tinted, vials b, c, d) is included in FIG. 1. IF-MS$_2$ powders, which were synthesized according to previously reported procedures (Feldman et al., 1995, 1996), did not form stable suspensions even after prolonged sonication. These results indicate that the intercalation of alkali metal atoms in the van der Waals gap of the IF particles led to a partial charge transfer to the host lattice which increased the polarizability of the nanostructures, enabling them to disperse in polar solvents. The transparency of the suspensions and their stability increased with the amount of alkali metal intercalated into the IF structures. Suspensions prepared from IF powder (both fullerene-like particles and nanotubes) which contained large amount of intercalant (>5%) were found to be virtually indefinitely stable. The optical absorption of the IF suspensions was very similar to that of thin films of the same nanoparticles.

EXAMPLE 6

In the next step, films were deposited on a gold substrate by electrophoretic deposition. Given the chemical affinity of sulfur to gold, it is not surprising that electrophoretic deposition led to relatively well-adhering IF films.

Figure 3D:

Furthermore, some selectivity with respect to the IF sizes and number of $MS_2$ layers in the films was achieved by varying the potential of the electrode. The thickness of the film was controlled by varying the electrophoresis time. FIG. 3d presents a TEM image of a very thin film (tens of nm) of IF particles together with the gold substrate. Since the nonintercalated IF particles do not form stable suspensions, films of such material were obtained by electrophoresis from vigorously sonicated dispersions of the IF powder.

EXAMPLE 7

Figure 5:
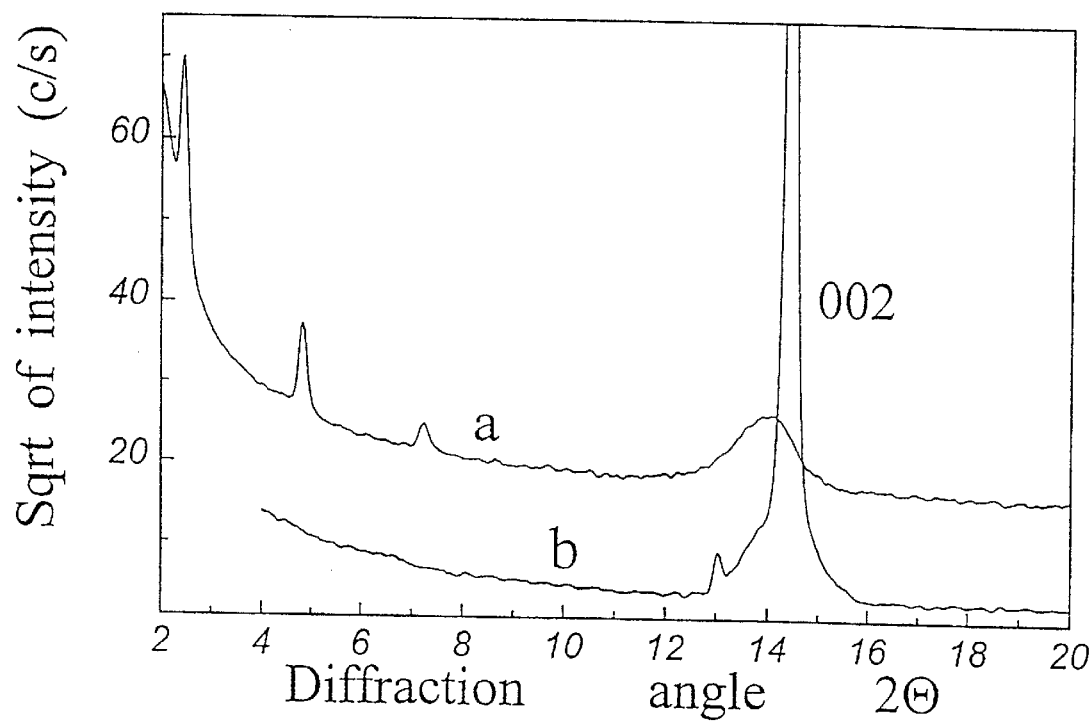
FIG. 5, curve (a), shows powder diffraction of IF-WS$_2$ with sodium as intercalant; and curve (b) shows WS$_2$ platelets (the peak at 13° is assigned to the CuK$_\beta$).To preclude parasitic scattering, the specimens were deposited on background-free single crystal quartz plates. Step size was 0.005° and exposure time was 6 s/point. The square root intensity presentation was used to increase the dynamic range of the figure.

Using X-ray photoelectron spectroscopy (XPS) analysis, the alkali content of the IF particles was found to vary from 4–10 atom %, depending on the parameters of preparation of the oxide precursor and the subsequent sulfidization process. X-ray diffraction patterns of IF-$WS_2$ and 2H-$WS_2$ powders were measured using CuKa radiation (FIG. 5). The most pronounced evidence for the formation of fullerene-like particles is the shift of the (0002) Bragg diffraction peak toward lower angles and the simultaneous broadening of this peak. The shift reflects the strain relief mechanism associated with folding of S-W-S layers (Feldman et al., 1995, 1996). The peak broadening is due to the reduced domain size for coherent X-ray scattering in the direction perpendicular to the basal (0001) plane. The expansion along the c-axis of the IF particles (ca. 2–4%) may also reflect the random distribution of the intercalated atoms, at least in a subgroup of the IF particles. However, the variation between the lattice spacing ($d_{0002}$) of the IF particles, which are doped with different alkali atoms, is small (6.35 Å for Na compared to 6.45 Å for K). The appearance of superstructure Bragg diffraction peaks at small angles (FIG. 5) strongly indicates the presence of an ordered IF phase with staging. The three (0001) Bragg reflections allude to a sixth stage (n=6) in IF-$WS_2$, i.e. the two Na layers are separated by 6 $WS_2$ layers. The repeat distance between the adjacent intercalated layers varies from 36.7 Å for Na to 38.9 Å with K. These results suggest that two populations of fullerene-like particles exist, one having ordered dopant atoms (staging) with n=6, the other with randomly distributed alkali atoms. Since the number of $MS_2$ layers in the IF particles varies from about 4 to 10, those particles with fewer than 6 layers cannot exhibit staging, and consequently a random distribution of the alkali metal atoms is thermodynamically favored in this case. It was reported (Somoano et al., 1973) that intercalation of alkali metal atoms into the lattice of 2H-$MoS_2$ did not lead to staging and, furthermore, the intercalated material was found to be extremely sensitive to air and moisture. Finally, two additional weak diffraction peaks with lattice spacing of 2.81 and 3.03 Å were observed. These peaks were assigned to a microphase of NaNO3, which might be formed through the reaction of forming gas ($N_2$-95%/$H_2$-5%) with oxygen during sulfidization of the oxides.

EXAMPLE 8

The optical absorption spectra of intercalated 2H-$MoS_2$ did not show appreciable changes for alkali metal concentrations less than 30%, where a transition into a metallic phase at room temperature and a further transition into a superconductor at about 3–7 K were reported (Brec and Rouxel, 1986; Somoano et al.,1979). Since the concentration of the intercalating metal atoms did not exceed 10% here, no changes in the optical transmission spectra were anticipated nor were found to occur. The intercalation of alkali atoms in the IF particles also induces n-type conductivity of the host.

EXAMPLE 9

Figure 6:
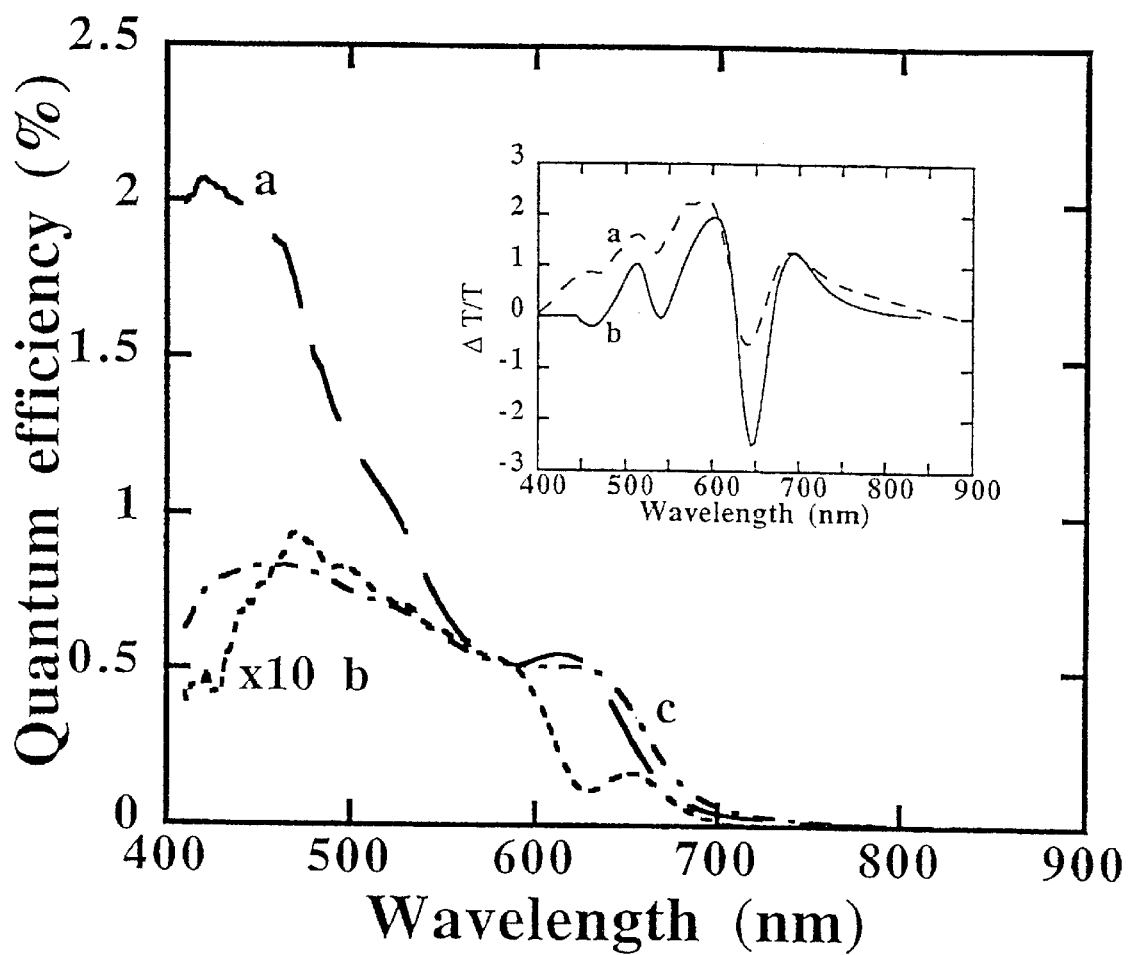
FIG. 6 shows photoresponse spectra of thin films of IF-WS$_2$: (a) IF film with low density of dislocations; (b) film consisting of IF particles with a high density of dislocations; and (c) nanotubes. The inset presents EET spectra of: (a) dislocation-free IF film and (b) nanotubes. The EET spectra were obtained by measuring the transmission spectrum while superimposing an ac modulation of 0.45 V on the photoelectrode.

The prevalence of dangling bonds on the prismatic faces of 2H—$WS_2$ crystallites leads to rapid recombination of photo excited carriers. Consequently, the performance of thin film photovoltaic devices of layered compounds has been disappointing. The absence of dangling bonds in IF material suggested to us that this problem could be alleviated here. Therefore the photocurrent response of IF-$WS_2$ films in selenosulfate solutions was examined and compared to that of 2H-$WS_2$ films. The response was found to be very sensitive to the density of dislocations in the film. Curve a of FIG. 6 shows the quantum efficiency (number of collected charges/number of incident photons) of a typical nested fullerene ($WS_2$) film with a low density of dislocations, as a function of the excitation wavelength. On the other hand, films having nested fullerene-like particles with substantial amounts of dislocations exhibited a poor photoresponse and substantial losses at short wavelengths (curve b), which indicate that the dislocations impair the lifetime of excited carriers in the film. Films of nanotubes also showed substantial photoresponse (curve c). Finally, films made of 2H-$WS_2$ platelets (each about 1 mm in size), which are known to have many recombination centers on the prismatic edges (1120), did not exhibit any measurable photoresponse under comparable conditions. The photocurrent decreased with negative bias, reaching zero at −1.0 v vs. the Pt foil counterelectrode, thus affirming that the intercalated IF particles were n-type. The photoresponse of the IF films did not show any degradation after 48 hr of continuous illumination. Electrolyte electrotransmission (EET) spectra of the IF films were also recorded (Bordas, 1976). The inset of FIG. 6 shows such a spectrum, which clearly reveals the direct excitonic transitions of the film at 2.02 (A exciton) and 2.4 eV (B exciton), respectively.

EXAMPLE 10

STM was used to probe the photoresponse of individual IF particles electrodeposited on a gold film. Initially, STM measurements were made in the dark. Both INV spectroscopy and topographic images were made. The I/V spectroscopy yielded either ohmic behavior (not shown) corresponding to exposed gold regions on the surface or a currentless region centered around 0 V bias corresponding to the "bandgap" of the individual IF particle (curve a of FIG. 7). These data must be interpreted in the framework of a metal—semiconductor—metal structure. The log of the current increases linearly with voltage, behavior which is associated with Poole conduction (Geddes et al., 1990). The slight current enhancement in the positive sample bias region is expected for the n-type IF under the experiment. The I/V curve could be used to determine tunneling conditions which do not sweep the IF particles away by the tip: the bias was set to 1.5 V with current setpoint <1 nA. Photoresponse was then measured by illuminating the junction with modulated 650 nm light. The laser was applied after observing no photo effect when using 0.5 W, mildly focused with light. Using the lock-in output as a measure of the photoresponse, two effects can be observed by comparing curves b and c of FIG. 7. First, the signal level is raised over the entire voltage scan. Secondly, significant enhancement of the signal was observed at positive sample bias. Note that curve c in FIG. 7 was attenuated by a factor of 4 to keep it on scale. The peak at negative bias seen in both curves is an artifact due to capacitative pickup.

Figure 7:
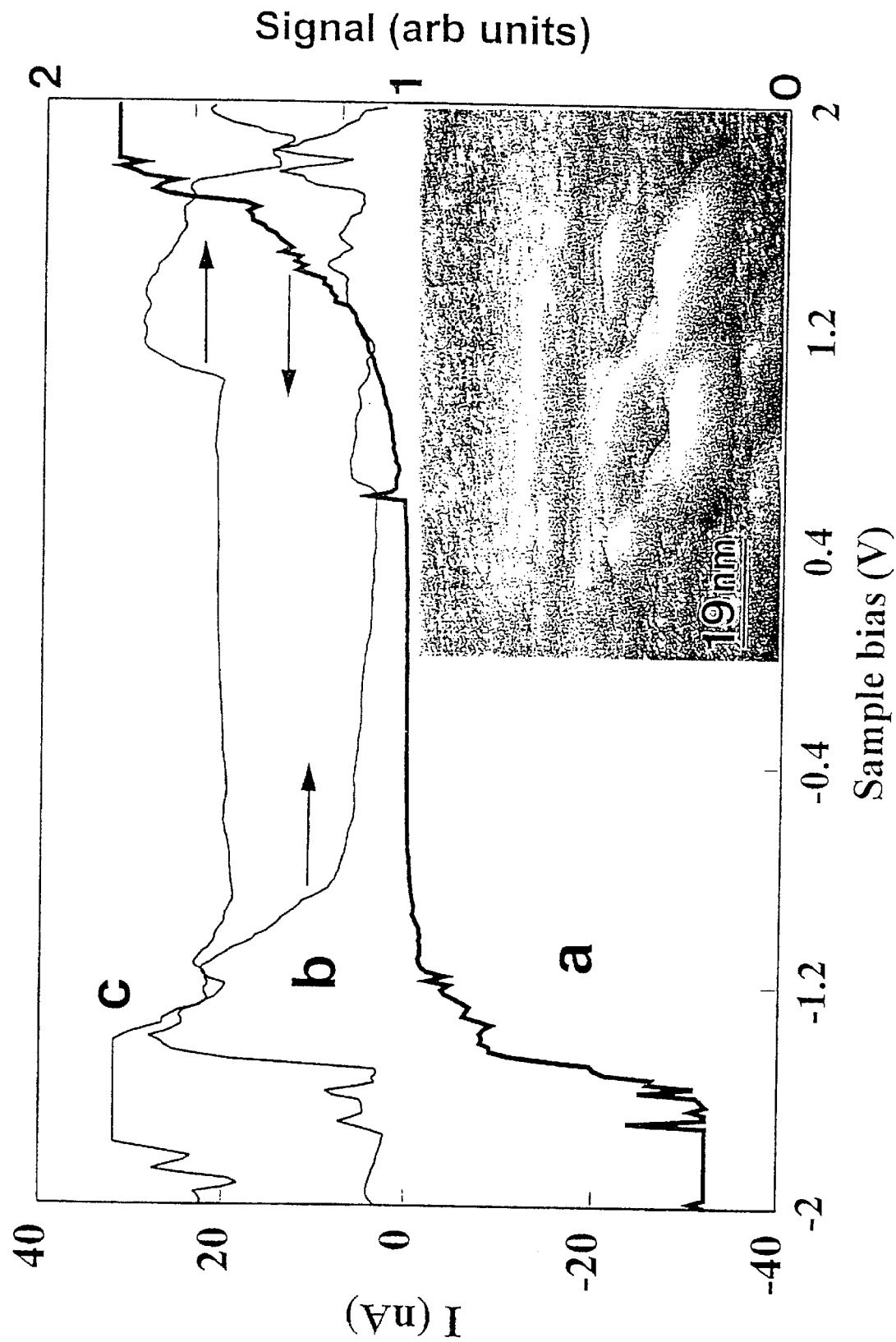
FIG. 7 shows scanning tunneling current spectroscopy of fullerene-like WS$_2$ films deposited on a gold substrate, using a Pt-Ir tip. Curve a is an I-V plot showing a bandgap of about 1.6 eV; curve b shows background ac signal without illumination; and curve c- shows an I-V plot under modulated 650 nm illumination, attenuated by a factor of 4. The modulation signal represents the lock-in output in arbitrary units, whereas the I-V signal is in nA. The peaks at negative sample bias in curves b and c are an artifact due to capacitive pickup. Prior to the measurements, the sample was wetted with selenosulfate solution, and then dried for about 30 min. Inset: topography taken with a sample bias of 50 mV; a current setpoint of 0.7 nA, under cw laser illumination (650 nm), showing a group of fullerene-like structures on a gold terrace. The illumination induces strong tunneling current over the IF, allowing it to be seen as protrusions on the surface (contrast to curve a).

The current enhancement under illumination was exploited to improve the STM imaging of the individual fullerene-like particles. Using a bias voltage of 50 mV, conditions which would not allow observation of the fullerene-like particles in the dark, the sample was imaged under CW illumination. The resulting image is shown in the inset of FIG. 7. The contrast between the IF particles and the gold substrate stems from the photosensitivity of the former, which produced large current contrast even under small bias. This effect also indicates that the response is due to photocurrent, not photovoltage, which would have a much smaller current dependence on distance. Choice of small bias sets the tip-surface distance and hence impedance to a relatively low value, which increases sensitivity to the photocurrent. The photoassisted STM imaging was obtained only after the film was wetted by a drop of a selenosulfate solution.

The effect of the tip proximity in the STM experiments must also be considered: tip-induced band-bending due to a surface space-charge region can lead to a reduced current for the lower bias values. Although the Na concentration is high enough to lead to a very small space-charge region if there was full charge transfer from the alkali metal atoms to the host, the actual charge transfer is only partial.

EXAMPLE 11

The photocurrent observed in the IF film can be explained by separation of photogenerated charges by a space charge layer in the semiconductor, which however is not likely to be very large in these nanostructures. A second possible explanation may be that the photocurrent flow is determined by preferential trapping/transfer of either photogenerated electrons or holes. In this scenario, the free charge defines the position of the Fermi level upon illumination. Photosensitive films of this kind can be used for various purposes, including the photoremediation of water, photochemical storage of solar energy, etc. The d-d nature of the photoexcitation process prohibits degradation of the film photoresponse over extended periods of time (24).

Figure 8:
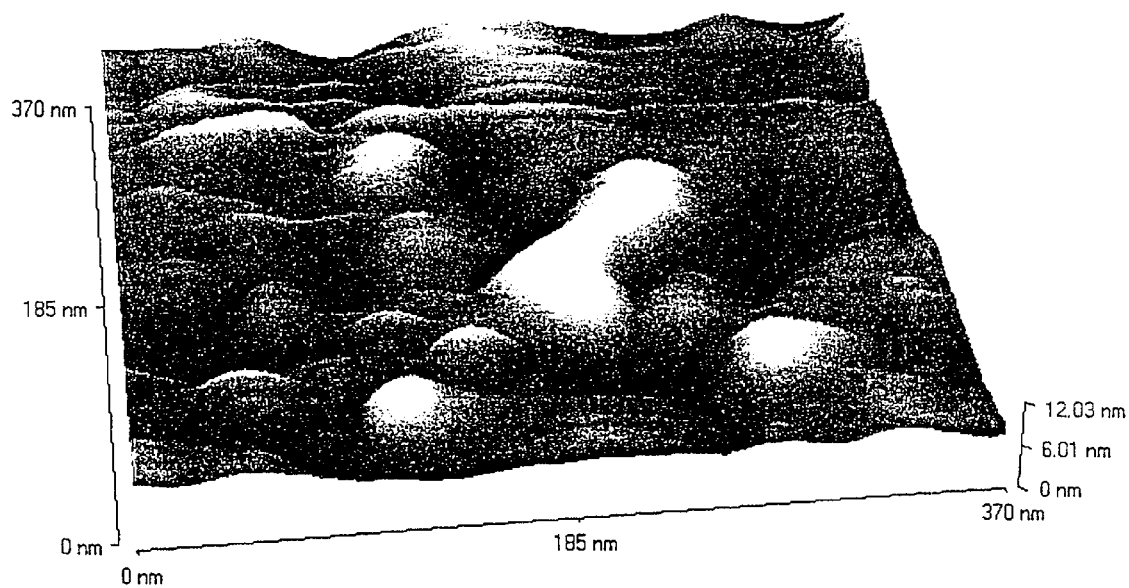
FIG. 8 shows contact-mode SFM image of the IF-WS$_2$ film used in the experiments of FIG. 5, obtained with the Si/IF composite tip, which was prepared by electrophoretic deposition of IF film on the Si tip. To prepare the IF coated tip, the Si cantilever was inserted into the IF suspension with an average particle size of 30 nm. A Pt foil served as anode, and a bias of 20 V was applied between the cathode and anode for ca. 1 min.

We found that the relatively low affinity of the IF to any surface made their imaging with scanning force microscopy-SFM, problematic. Using contact-mode SFM with Si or $Si_3N_4$ cantilever/tip, the fullerene-like particles were brushed aside and the images were blurry and irreproducible. This was true both at ambient and low humidity conditions, and using cantilevers with lateral (torsional) spring constants of 3–250 N/m, with the lowest workable loading force, typically 5–20 N/m. Using the noncontact mode, the IF were clearly seen, which proves that this imaging problem is related to the affinity between the tip and surface. To reduce the interaction between the tip and the IF, thin layer of $IF-WS_2$ particles was deposited from the alcoholic suspension, using the Si cantilever/tip as a cathode. With this new tip, clear images of the IF film surface were obtained in contact mode (FIG. 8). This "IF-tip" was extremely robust, and was used to image several surfaces at high and low forces without degradation. The reason for the stability of this composite Si/IF tip compared to evaporated or electrodeposited IF film, has yet to be determined. Presumably, the stability of this composite tip is related to the presence of a high electric field because of the sharp tip, which makes a more stable bond between the IF particle and the Si tip. By imaging a Nb thin film surface with sharp features (General Microdevices), we estimate this tip radius to be 20 nm, which coincides with a typically sized IF particle. This new composite tip is now being considered for SFM-imaging of various objects.

EXAMPLE 12

Tungsten wire (0.5 mm) was connected to Cu electrodes within a bell-jar which were connected to a power supply outside the bell-jar. In order to clean the wire, the belljar was evacuated to $10^{-5}$ Torr and the tungsten wire was heated close to its melting point for a few minutes. The wire was cooled down to ambient temperature and the bell jar was opened. 6 mg of NaCl were dissolved in 1 liter of ultrapure water, which produced a mother solution of $10^{-4}$M with respect to the salt. Salts of other alkali metals or transition metals were also dissolved in concentrations ranging between $10^{-4}$ to $10^{-3}$ M and then codeposited to give metal-doped oxide powder with particles of about 30–50 nm in diameter. Higher concentrations of the metal salt were also used but produced fullerenes of poorer quality and morphology, after annealing in $H_2S$ atmosphere. If no metal was dissolved in the water, the metal containment in the resulting oxide depended on the purity of the source water. At this point, a beaker containing 3–5 ml of water was put in the bell-jar close to the wire. The bell-jar was evacuated again until the water became frozen and the vacuum reached about $10^{-3}$ Torr. At this stage the vacuum pump was turned-off (gate shuttered); the power supply was turned-on and the tungsten wire was heated to a red color. The process was continued and deep blue-purple powder accrued on the walls of the bell-jar. The power-supply was turned-off when the current started to fluctuate (5–7 min). The bell-jar was cooled down and the powder was collected from the walls. The oxide powder was examined by a number of techniques. Transmission electron microscopy (TEM) and electron diffraction (ED) were used to examine the size distribution of the nanoparticles and the degree of crystallinity. In addition, powder x-ray diffraction (XRD) was used to identify the phases and the average crystallinity of the powder. The typical size of the particles was 50–60 nm as shown in FIG. 2c and they were mostly amorphous. XPS revealed that the powder consisted of suboxide of the average formula $WO_{2.8}$. XPS was also used to estimate the amount of alkali metal (Na) in the oxide, which was found to vary from 4–8 atom %.

EXAMPLE 13

This experiment was performed as described in Example 12, except for the amount of water in the bell-jar in the first step, that was around 2 ml, and the deposition time for the oxide powder, that was 4 min. In this case, the Na-doped tungsten oxide powder obtained exhibited a deeper blue color and the nanoparticles were of an average size of 4–5 nmn, as determined both by XRD and TEM measurements, and shown in FIG. 2b.

EXAMPLE 14

Whiskers of tungsten oxide were prepared by a similar procedure to the previous examples 12–13, except that in the second step the vacuum system was partially left on during the heating process of the tungsten wire. Tungsten oxide whiskers of 300 nm average length and 15 nr diameter were obtained (shown in FIG. 2d).

EXAMPLE 15

This experiment was carried out similar to Example 14 but the salts added to the water were $CoCl_2 \cdot 6H_2O$ and $FeCl_3 \cdot 6H_2O$ (atomic ratio 1/1), in the concentration of $10^{-3}$ M. The average length of the Co+Fe-doped tungsten oxide whiskers increased to 500 nm, instead of the average size of 300 nm in the absence of the transition metal ions.

EXAMPLE 16

A pellet of vanadium pentoxide ($V_2O$) was put in a tungsten boat and connected to the Cu electrodes within the bell-jar. The rest of the process followed examples 12 and 13, but the first (cleaning) step was omitted in this case. Na-doped $V_2O_5$ nanoparticles were obtained.

EXAMPLE 17

Indium ingot was put in the tungsten boat, heated to melting under $10^{-5}$ Torr. A spherical drop of In melt was formed and the process continued until the sphere became shiny with a metallic luster (ca. 6 min). The power supply was turned down and the rest of the process followed examples 12 and 13. Na-doped $In_2O_3$ nanoparticles were obtained.

EXAMPLE 18

$WO_{2.8}$ powder with particles of average size of 60 nm (NaCl or KCl doped) was annealed in forming gas (5%$H_2$;95%/$N_2$) atmosphere and $H_2S$ gas at 800° C. for 30 min until all the oxide was converted into tungsten disulfide ($WS_2$). The powder was examined, in addition to the methods of Example 1, also by low angle X-ray diffraction technique. The particles were shown to have fullerene-like structure (FIG. 3a) of an average size of about 30 nm. The XRD spectrum (FIG. 4) shows clearly a strong (0002) peak at 14.0°. Low angle diffraction peaks are a manifestation of sodium intercalation. The diffraction strongly indicates a staging of n=6, i.e. 6 layers of $WS_2$ followed by a layer of sodium. The peaks can be translated according to the Bragg law into the following repeat distance between intercalated metal layers: 3.67 nm for Na intercalation and 3.89 nm for K intercalation.

EXAMPLE 19

Tungsten oxide powder consisting of nanowhiskers was annealed according to the procedure of Example 3. FIG. 3b shows an assortment of $WS_2$ nanotubes.

EXAMPLE 20

Figure 9:
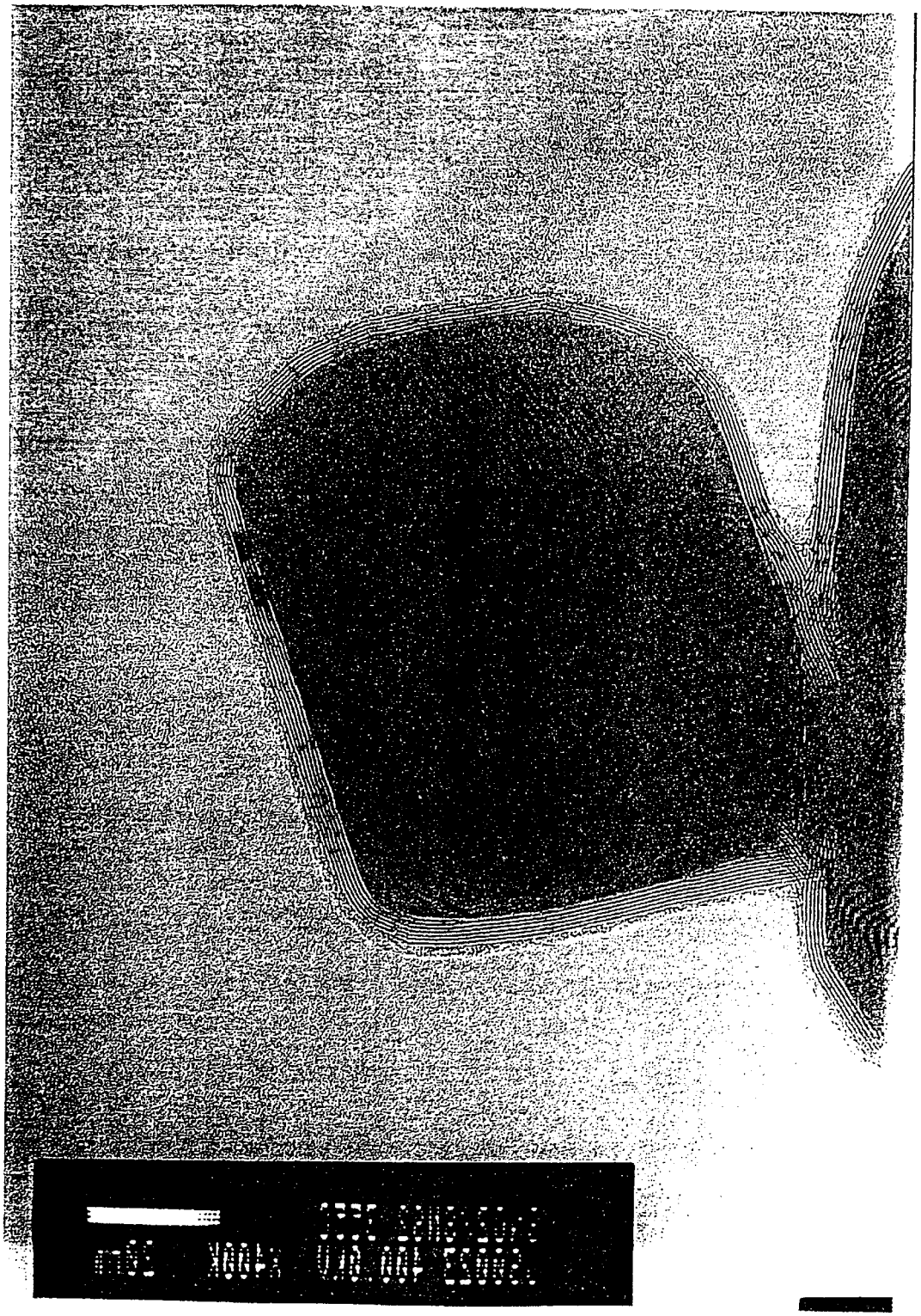
FIG. 9 shows TEM image of IF-SnS$_2$ nanoparticles obtained by the process of the invention.

Sn ingot was heated in a tungsten boat to melting under $10^{-5}$ Torr. A spherical drop of Sn melt was formed and the process continued until the sphere became shiny with a metallic luster. The power supply was turned down and the rest of the process followed examples 12 and 13.The Na-doped $SnO_2$ obtained was annealed with $H_2S$. FIG. 9 shows an IF-$SnS_2$ nanoparticle obtained through this process.

EXAMPLE 21

A Nb ingot (20 g) was placed in an electron beam evaporation apparatus. The ingot was degassed at $10^{-6}$ Torr by bombardment with electron beam for 20 min, the vacuum was broken for a very short time (<I min) and a beaker containing 15 ml of water was inserted. The vacuum was restored and the electron beam source (tungsten wire) was actuated through heating (20 kV; 6 mA). At this point a gray-white powder of amorphous Na-doped niobium oxide accrued on the bell-jar walls. When the process ended, the oxide powder was collected, rinsed with ethanol and subsequently analyzed by TEM; XRD, etc. Instead of water, an oxygen-containing volatile solvent such as acetone or ethanol, can be used.

EXAMPLE 22

This experiment was carried out as in Example 2 with a V ingot (20 g). An olive green powder of amorphous Na-doped vanadium oxide accrued on the bell-jar walls.

EXAMPLE 23

Applications of the doped metal oxides and of the metal-encaged metal chalcogenides.

The metal II-doped metal oxides prepared by the method of the invention have several applications. The basic unit block of many of the transition metal oxides consists of a central metal atom and 6 oxygen atoms in the vertices of an octaheder. In the $ReO_3$ structure the octaheders are connected through their corners, and so each oxygen is shared by two octaheders, while for the rutile structure they are connected through edges and hence each oxygen atom is shared between three octaheders. Powder of oxide nanoparticles have number of important applications, in ceramics, catalysis, electrochromism (photochromism) and batteries. In all these fields the size of the nanoparticles; its structure; chemical composition; and its surface structure, play a major role in its functionality.

23 (a) Photochromism and electrochromism: The ability of an oxide particle to modify its absorption spectrum according to the oxidation state of the central metal atom can be utilized, e.g. for control of the transmissivity of windows (windshields) according to the hour of the day or the intensity of the lights of the coming car (smart windows) (see S. K. Deb, *J. Chem. Phys.*, 37, 4818 (1966); *Philos. Mag.*, 27, 807 (1973)). Application in information storage is also potentially very important (see R. J. Colton, A. M. Guzman and J. W. Rabalais, *Acc. Chem. Res.*, 11, 170 (1978), however crystalline oxide films suffer from a major drawback, i.e. the color change is rather slow. The speed of the insertion reaction of M (M=H, Li, Na, K . . . ) ions was found to be much faster with amorphous oxide particles (see J. N. Yao, K. Hashimoto, and A. Fujishima, *Nature*, 355, 624 (1992).

The metal-doped metal oxide nanoparticles obtained by the present invention have higher conductivity than the free metal oxide particles and hence they can exhibit color changes due to applied bias with smaller resistive (potential) losses, which is advantageous, in particular for large surfaces (windows, etc.). Sulfidizing the topmost surface of the metal-doped oxide brings about a slight color change (darker color). However, it has the advantage that it preserves the particle size and shape after many charge/discharge cycles.

For the manufacture of an electrochromic device based on a metal-encaged IF structure of $WS_2$, Na-doped $WO_3$ powder with particle sizes of the order of 50 nm was used as the starting material. Reduction and surface sulfidization was carried-out in $H_2S$—$H_2/N_2$ gas mixture as described herein. Nanocrystallites consisting of 2 closed shells of IF-$WS_2$ and oxide core were prepared in this way. The starting material had very light brown color at this stage. The powder was suspended in ethanol and electrophoretically deposited onto indium-tin oxide (ITO) glass with a typical transparency of 85% and resistivity of 20 Ohms/square. A Pt plate served as counter electrode. A propylene carbonate solution containing 0.3 M $LiClO_4$ and 0.03 M $LiBF_4$ was used for the cell. Scanning the film in the cathodic direction resulted in deep blue coloration of the film. The color of the film was bleached upon anodic scan. This process was repeated 5 times.

23 (b) Intercalation batteries and fuel cells: Li rechargeable batteries are based on Li ions in electrolyte solutions, which are intercalated to the negative electrode and deintercalated from the positive electrode. Upon reversal of the potential direction, the opposite process occurs (see A. R. Armstrong and P. G. Bruce, *Nature*, 381, 499 (1996). The electrodes are therefore made of materials that can intercalate/deintercalate the Li ions. The use of various oxide hosts, like $MnO_2$, $Mn_2O_4$, $V_2O_5$, $CoO_2$, $MoO_3$, $WO_3$, and $TiO_2$ for insertion and intercalation in Li batteries is being intensively investigated (see H.-K. Park, W. H. Smyrl, and M. D. Ward, *J. Electrochem. Soc.*, 142 1068 (1995)); S. Y. Huang, L. Kavan, I. Exnar, and M. Grätzel, ibid., 142, L142 (1995)). $V_2O_5$ is also used in the photographic industry for antistatics (prevention of charge accumulation). The application of a composite $Pt/WO_3$ electrode for the oxidation of methanol and formic acid in acidic solutions, which could be used as the anode in a fuel cell, was reported. ( K. Y. Chen, P. K. Shen, and A. C. C. Tsueng, *J Electrochem. Soc.*, 142, L54 (1995).

Many of the currently investigated Li rechargeable batteries use either oxides or sulfides as electrode materials. The use of a metal-doped, e.g. Li-doped, $V_2O_5$ nanoparticles encaged by 1–2 layers of vanadium disulfide $VS_2$ has the advantage that the sulfide layer preserves the integrity of the oxide nanoparticles for many charge/discharge cycles without influencing too much the diffusivity of the Li into the oxide or its out diffusion from the oxide nanoparticle.

For a Li rechargeable battery, Li-doped $V_2O_5$ powder consisting of particles of average diameter of 100 nmm was prepared according to the procedure described in Examples 12 and 13. Annealing of this powder (1 min) under $H_2S$/forming gas atmosphere at 830° C. lead to the formation of 1–2 complete monolayers of vanadium disulfide on the outer circumference of the oxide nanoparticle. Thus a powder consisting of nanocrystallites with vanadium oxide core and thin vanadium disulfide shell was obtained. The powder was mixed with polymer binder and span coated on Ti substrate. Subsequently, the specimen was dried in 60° C. This specimen served as cathode in the battery. For the anode, Li—Al alloy was used. Ethylene carbonate-propylene carbonate electrolyte was used in the cell. Polypropylene foil was used as separator. The theoretical open circuit voltage of the cell is 3.2 V. The initial voltage of the cell was measured to be 2.95 V. The cell was discharged for 10 hours at 1 $mA/cm^2$. During this period of time the voltage dropped from 2.9 to 2.5 V.

For a hydride battery, Na-doped WO3 powder consisting of particles of average diameter of 100 nm was prepared according to the procedure described in Examples 12 and 13. Annealing of this powder (1 min) under $H_2S$/forming gas atmosphere at 830° C. lead to the formation of 1–2 complete monolayers of tungsten disulfide on the outer circumference of the oxide nanoparticle. Thus a powder consisting of nanocrystallites with (reduced) oxide core and thin sulfide shell was obtained. The powder was mixed with polymer binder and span coated on W substrate. Subsequently, the specimen was dried in 60° C. This specimen served as anode in the battery. For the second electrode (cathode), carbon black powder was mixed with polymeric binder and $MnO_4$/$MnO_2$ mixture. 4M $H_2SO_4$ solution served as an electrolyte.

Ionic membrane was used to separate the two half cells. In the present form, the cell is in the discharged state. The theoretical open circuit voltage of the cell is 1.65 V. The initial voltage of the cell was measured to be 1.6 V. The cell was discharged for 8 hr at 1.0 $mA/cm^2$. During this period of time the voltage dropped from 1.65 to 1.2 V. The charge/discharge cycles were repeated three times.

For a rechargeable battery, Co-doped $WO_3$ powder consisting of particles of average diameter of 100 nm was prepared according to the procedure described in Examples 12 and 13. Annealing (1 min) of this powder under $H_2S$/forming gas atmosphere at 830° C. lead to the formation of 1–2 complete monolayers of tungsten disulfide on the outer circumference of the oxide nanoparticle. Thus a powder consisting of nanocrystallites with oxide core and thin sulfide shell was obtained. The powder was mixed with polymer binder and span coated on Ti substrate. Subsequently, the specimen was dried in 60° C. This specimen served as anode in the battery. For the second electrode (cathode), carbon black powder was mixed with polymeric binder and $MnO_2$. 4M $H_2SO_4$ solution served as an electrolyte. Ionic membrane was used to separate the two half cells. In the present form, the cell is in the discharged state. The theoretical open circuit voltage of the cell is 1.5 V. After charging in a galvanostatic mode at 2 $mA/cm^2$, the cell was discharged. The initial voltage of the cell was measured to be 1.4 V. The cell was discharged for 5 hours at 1 $UA/cm^2$. During this period of time the voltage dropped from 1.4 to 1.1 V. This procedure was repeated 4 times.

REFERENCES

1. B. Alperson, S. Cohen, I. Rubinstein and G. Hodes, *Phys. Rev.* 1995, B 52: R17017
2. Ayajan and Iijima, S. *Nature* 1993, 361: 333.
3. Bethune et al. *Nature* 1993, 362: 605.
4. R. Brec and J. Rouxel, in *Intercalation in Layered Materials*, Ed. Dresselhaus, M. S., NATO ASI Series B: Physics Vol. 148, Plenum Press, New York (1986), pp. 75–91.
5. N. G. Chopra, R. J. Luyken, K. Cherrey, V. H. Crespi, M. L. Cohen, S. G. Louie and A. Zettl, *Science* 1995, 269: 966.
6. H. Dimigen et al., *Thin Solid Films*. 1979, 64: 221.
7. B. Dunlap, *Phys. Rev. B.* 1992, 46:1933.
8. Y. Feldman, E. Wasserman, D. J. Srolovitz and R. Tenne, *Science* 1995, 267: 222.
9. Y. Feldman, G. L. Frey, M. Homyonfer, V. Lyakhovitskaya, L. Margulis, H. Cohen, G. Hodes, J. L. Hutchison and R. Tenne, *J Am. Chem. Soc.* 1996, 118: 5362.
10. R. H. Friend and A. D. Yoffe, *Adv. Phys.* 1987, 36:1.
11. Y. Golan, L. Margulis and I. Rubinstein, *Surf Sci.* 1992, 264: 312.
12. M. Homyonfer, Y. Mastai, M. Hershfinkel, V. Volterra, J. L. Hutchison and R. Tenne, *J Am. Chem. Soc.*1996, 118: 7804.
13. S. Iijima, *Nature* 1991, 354: 56.
14. S. Iijima, T. Ichihashi and Y. Ando, *Nature* 1992, 356: 776.
15. S. Iijima, and T. Ichiashi *Nature* 1993, 363: 603.
16. P. Jonson, R. F. Frindt and S. R. Morrison, *Mater. Res. Bull.* 1986, 21: 457.
17. Margulis et al. *Nature* 1993, 365: 113.
18. R. B. Somoano, V. Hadek, and A. Rembaum, *J Chem. Phys.* 1973, 58: 697.
19. R. B. Somoano and J. A. Woollam, in *Intercalated Layered Materials*, Ed. F. Levy, D. Reidel Publishing Company, Dordrecht (1979), pp. 307–319.

20. Srolovitz et al. *Phys. Rev. Lett.* 1995, 74: 1779.
21. O. Stephan, P. M. Ajayan, C. Colliex, Ph. Redlich, J. M. Lambert, P. Bernier and P. Lefin, *Science* 1994, 266: 1683.
22. R. Tenne, L. Margulis, M. Genut and G. Hodes, *Nature* 1992, 360: 444.
23. H. Terrones, M. Terrones and W. K Hsu, *Chem. Soc. Rev.* 1995, 341.
24. D. Ugarte, *Nature* 1992, 359: 707.
25. A. F. Wells, *Structural Inorganic Chemistry*, third ed., Oxford University Press, Oxford (1962); p.468.
26. M. José Yacarán et al., *AppL Phys. Lett.* 1996, 69: 1065.
27. 0. Zhou, R. M. Fleming, D. W. Murphy, C. H. Chen, R. C. Haddon, A. P. Ramirez and S. H. Glarum, *Science* 1994, 263: 1744.

What is claimed is:

1. A method for the preparation of nanoparticles or nanowhiskers of a metal II-doped metal I oxide, wherein said metal I is selected from In, Ga, Sn and a transition metal and said metal II is any metal, which method comprises:
   (i) heating a metal I material with water in a vacuum apparatus at a base pressure of $10^{-3}$ to $10^{-5}$ Torr or electron beam evaporating a metal I material with water or with an oxygen-containing volatile solvent in a vacuum apparatus at a base pressure of $10^{-5}$ to $10^{-6}$ Torr, in the presence of a metal II salt;, and
   (ii) recovering the metal II-doped metal I oxide powder from the walls of the vacuum apparatus.

2. A method according to claim I wherein said transition metal I includes Mo, W, V, Zr, Hf, Pt, Re, Nb, Ta Ti, and Ru, and said metal II is selected from an alkali, alkaline earth or a transition metal.

3. A method according to claim 1 wherein said metal II salt is an alkali metal chloride.

4. A method according to claim 1, wherein said metal II-doped metal I oxide is a metal II-doped mixed oxide of 2 or more different metal I atoms.

5. A method according to claim 1 for the preparation of nanoparticles or nanowhiskers of doped metal oxides selected from Na—, K—, Li— or Cs-doped $MoO_{3-x}$, preferably $MoO_2$ and $MoO_3$, or Na—, K—, Li— or Cs13 doped $WO_{3-x}$, preferably $WO_3$ and $W_{18}O_{49}$, and Na—, K—, Li— or Cs-doped mixed Mo/W oxide consisting of $Mo_xW_{1-x}O_3$, wherein x is from 0 to 1.

6. A method according to claim 1 wherein said metal II salt is added to the water or to the oxygen-containing volatile solvent.

7. A method according claim 1, wherein said metal II salt is NaCl or KCl and it is already present in the water.

8. A method for the preparation of metal II-intercalated and/or metal II-encaged inorganic fullerene-like (IF) structures of a metal I chalcogenide, wherein said metal I is selected from In, Ga, Sn and a transition metal and said metal II is any metal, which method comprises:
   (i) heating a metal I material with water in a vacuum apparatus at a base pressure of $10^{-3}$ to $10^{-5}$ Torr or electron beam evaporating a metal I material with water or with an oxygen-containing volatile solvent in a vacuum apparatus at a base pressure of $10^{-5}$ to $10^{-6}$ Torr, in the presence of a metal II salt;
   (ii) aimealing the metal II-doped metal I oxide obtained in step (i) in a reducing atmosphere with a $H_2X$ gas, wherein X is S, Se, or Te; and
   (iii) recovering the metal II-intercalated and/or metal II-encaged inorganic fullerene-like (IF) structures of the metal I chalcogenide.

9. A method according to claim 8 wherein said metal II-intercalated and/or metal II-encaged inorganic fullerene-like structures of a metal I chalcogenide are structures having one layer or nested layers which form a closed cage which may encage a core or may form a stuffed nested layer structure, particularly structures selected from single and double layer inorganic fullerene-like structures, nested layer inorganic fullerene-like structures, stuffed inorganic fullerene-like structures, structures with negative curvature (Schwartzites), single layer nanotubes, nested nanotubes and stuffed nanotubes.

10. A method according to claim 8 wherein nanoparticles of the metal oxide obtained in step (i) produce single layer IF and nested layer IF, and nanowhiskers of the metal oxide obtained in step (i) produce single layer and nested layer nanotubers.

11. A method according to claim 8, wherein said transition metal includes Mo, W, V, Zr, Hf, Pt, Re, Nb, Ta Ti, and Ru, and said metal II is selected from an alkali, alkaline earth or a transition metal.

12. Metal II-intercalated and/or metal II-encaged inorganic fullerene-like (IF) structures of a metal I chalcogenide, wherein said metal I is selected from In, Ga, Sn and a transition metal and said metal II is any metal.

13. The metal II-encaged inorganic fullerene-like (IF) structures of a metal I chalcogenide according to claim 12, wherein said structures include 1–2 layers of the metal I chalcogenide encaging a core of the metal II-doped metal I oxide.

14. A tip for scanning probe microscope coated with a single layer of a metal II-intercalated and/or metal II-encaged IF of metal I chalcogenide according to claim 13.

15. The metal II-intercalated inorganic fullerene-like (IF) structures of a metal I chalcogenide according to claim 12, wherein said structures include more than 2 layers of the metal I chalcogenide intercalated by metal II and encaging a core of the metal II-doped metal I oxide.

16. The metal II-encaged inorganic fullerene-like (IF) structures of a metal I chalcogenide according to claim 12, wherein said structures include more than 2 layers of the metal I chalcogenide intercalated with metal II and devoid of a core.

17. Metal II-intercalated and/or metal II-encaged inorganic fullerene-like (IF) structures of a metal I chalcogenide, according to claim 12, wherein said transition metal I includes Mo, W, V, Zr, Hf, Pt, Re, Nb, Ta Ti, and Ru, and said metal II is selected from an alkali, alkaline earth or a transition metal.

18. Use of metal II-intercalated and/or metal II-encaged inorganic fullerene-like (IF) structures of a metal I chalcogenide according to claim 12 as lubricant, particularly in solid lubrication.

19. A stable suspension in a polar solvent of at least one of a metal II-intercalated IF structure and a metal II-encaged IF structure of a metal I chalcogenide, wherein said metal I is selected from the group consisting of In, Ga, Sn and a transition metal, and said metal II is any metal.

20. A method for the production of thin films of metal II-intercalated and/or metal II-encaged IF structures of metal I chalcogenides, which comprises subjecting a stable suspension according to claim 19 to evaporation of the solvent or to electrophoretic deposition onto a conductive substrate.

21. Use thin films of metal II-intercalated and/or metal II-encaged IF structures of metal I chalcogenides obtained according to claim 20, as the photosensitive element in solar cells, for the fabrication of secondary batteries and in electrochromic devices.

* * * * *